United States Patent [19]
Fischer

[11] 4,128,467
[45] Dec. 5, 1978

[54] METHOD OF ION ETCHING Cd-Hg-Te SEMICONDUCTORS

[75] Inventor: Konrad Fischer, Bad Rappenau, Fed. Rep. of Germany

[73] Assignee: Licentia Patent-Verwaltungs-G.m.b.H., Frankfurt am Main, Fed. Rep. of Germany

[21] Appl. No.: 881,007

[22] Filed: Feb. 24, 1978

[30] Foreign Application Priority Data

Mar. 1, 1977 [DE] Fed. Rep. of Germany ....... 2708792

[51] Int. Cl.$^2$ ............................................. C23C 15/00
[52] U.S. Cl. .................................. 204/192 E; 156/643
[58] Field of Search ................... 204/192 E, 192 EC; 156/643; 219/121 EM

[56] References Cited

U.S. PATENT DOCUMENTS

| | | |
|---|---|---|
| 3,860,783 | 1/1975 | Schmidt et al. .............. 219/121 EM |
| 3,988,564 | 10/1976 | Garvin et al. ................ 219/121 EM |

OTHER PUBLICATIONS

P. G. Gloersen, "Masking for Ion Beam Etching", Solid State Technology, Apr. 1976, pp. 68–73.
P. G. Gloersen, "Ion-Beam Etching", J. Vac. Sci. Tech., vol. 12 (1975), pp. 28–35.
C. M. Melliar-Smith, "Ion Etching for Pattern Delineation", J. Vac. Sci. Tech., vol. 13, pp. 1008–1022 (1976).

*Primary Examiner*—John H. Mack
*Assistant Examiner*—Aaron Weisstuch
*Attorney, Agent, or Firm*—Spencer & Kaye

[57] ABSTRACT

A method of etching comprises etching a cadmium-mercury-telluride semiconductor layer by means of an ion beam.

8 Claims, 2 Drawing Figures

METHOD OF ION ETCHING Cd-Hg-Te SEMICONDUCTORS

BACKGROUND OF THE INVENTION

It is known that ion beams can be used to etch and structure silicon semiconductor arrangements.

SUMMARY OF THE INVENTION

According to the invention, there is provided a method of producing a structured semiconductor layer comprising etching a cadmium-mercury-telluride semiconductor with an ion beam.

Further according to the invention, there is provided a method of ion etching in order to structure semiconductor layers, characterized by its use on a semiconductor material made from cadmium-mercury-telluride.

BRIEF DESCRIPTION OF THE DRAWINGS

The invention will now be described in greater detail, by way of example, with reference to the drawings, in which.

DESCRIPTION OF THE PREFERRED EMBODIMENT

Cadmium-mercury-telluride is a very temperature-sensitive material since the mercury contained therein vaporizes at low temperatures. Surprisingly, it has been proved that despite this extreme temperature sensitivity semiconductor layers made of cadmium-mercury-telluride can be structured by an ion beam etching system. Moreover, it was surprising that cadmium-mercury-telluride has high erosion rates in relation to suitable covering materials such as a photoresist or titanium. Therefore it is easy to cover parts of the semiconductor surface which are not to be etched with a photoresist or with titanium so that the uncovered parts themselves of a relatively thick semiconductor layer made of cadmium-mercury-telluride can be removed with the aid of a suitable ion beam.

In relation to etching with chemical agents the ion etching method has the essential advantage that sharp edges are formed which are free of underetching so that very fine structures can be achieved.

Cadmium-mercury-telluride is a suitable semiconductor material for manufacturing infra-red detector cells. In order to manufacture these, it is necessary to proceed as before, for example, by adhering a semiconductor layer to a carrier member. This semiconductor layer may be comb-shaped in construction, for example, so that it comprises a wide web, numerous finger-shaped tongues of which being parallel to each other and extending in one direction. This comb-shaped semiconductor layer is covered over the whole of its surface with a contact metal which exposes only a small gap in each case in the junction region between the finger-shaped tongues and the wide web. This gap in which only infra-red light can be incident on the semiconductor layer forms a detector cell which is connected on the one hand to the wide web and on the other hand to a finger-shaped tongue. A connection, i.e., the wide web connecting the tongues together, is common to all of the detector cells. The ion etching method in accordance with the invention is used to structure the semiconductor layer in the manner described.

Figure 1:
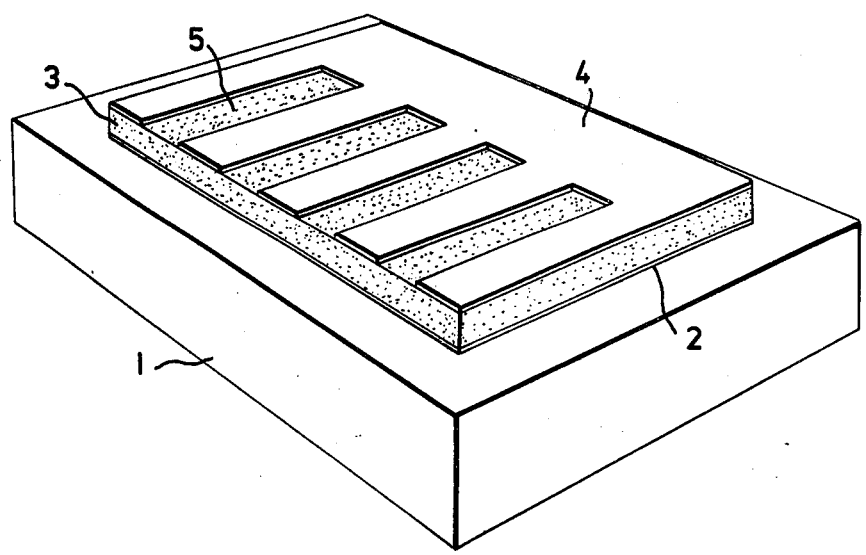
FIG. 1 is a perspective view of a carrier body with a film to be etched in accordance with the invention.

Referring now to the drawings, in FIG. 1, a carrier member 1 is shown in perspective view comprising ceramics or a sapphire, for example. With the aid of an adhesive layer 2, a semiconductor layer 3 made of $Cd_{0.2}Hg_{0.8}Te$ is fixed to this carrier member. This semiconductor layer which is sensitive to infra-red light is thinned, for example, to a thickness of 20 $\mu$m. The parts of the semiconductor surface which are not to be etched by the ion beam are then covered by a layer 4 which has a very small etching rate. A photoresist layer several $\mu$m thick or a titanium layer is suitable for this purpose. The parts 5 of the semiconductor surface which remain free on the other hand are to be removed to a depth as far as the carrier member 1.

The semiconductor arrangement shown in FIG. 1 is therefore introduced into an ion beam etching system. Argon ions arriving vertically on the semiconductor surface are preferably used for etching. In a successful test, the voltage was 700 V at a pressure of $8 \times 10^{-5}$ Torr. The etching time was 4 hours; the free parts of the semiconductor surface were removed during this time to a depth as far as the carrier member 1, whereby very sharply etched edges were obtained without underetching.

Figure 2:
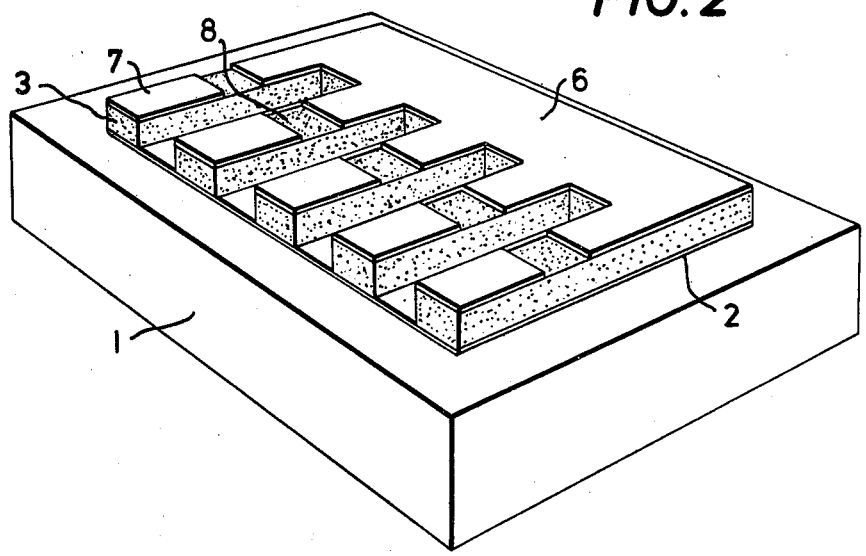
FIG. 2 is a view similar to FIG. 1 but after the completion of etching.

The semiconductor arrangement is shown in FIG. 2 after etching. The remaining comb-shaped semiconductor layer was provided with connecting contacts 6 and 7, whereby the uncovered gap 8 in the semiconductor surface forms a detector cell in each case. Note is made of the fact that during the previous ion etching of the semiconductor layer the photoresist layer 4 or some other type of covering layer is completely or partially removed. The thickness of the covering layer 4 is therefore to be selected with the material used in each case so that this covering layer is removed by the ion beam essentially only when the ion beam has etched away the semiconductor layer to a depth as far as the carrier member in the regions of the surface which were not covered.

What is claimed is:

1. A method of ion beam etching in order to structure semiconductor layers, characterized by its use on a semiconductor material comprising cadmium-mercury-telluride.

2. A method as defined in claim 1, wherein said semiconductor material comprises $Cd_{0.2}Hg_{0.8}Te$.

3. A method as defined in claim 1 and comprising covering the parts of the semiconductor surface which are not to be etched by a material of lower etching rate than said cadmium-mercury-telluride material.

4. A method as defined in claim 3, wherein said material of lower etching rate comprises a photoresist.

5. A method as defined in claim 3, wherein said material of lower etching rate comprises titanium.

6. A method as defined in claim 1, wherein a beam of argon ions reaches the semiconductor surface perpendicularly in a high vacuum.

7. A method as defined in claim 1, and comprising arranging a thin semiconductor layer on a carrier member, and selectively removing portions of said semiconductor layer to a depth as far as said carrier member by means of an ion beam.

8. A method of producing a structured semiconductor layer comprising etching a cadmium-mercury-telluride semiconductor with an ion beam.

* * * * *